United States Patent [19]
Mack et al.

[11] Patent Number: 5,115,206
[45] Date of Patent: May 19, 1992

[54] MERGED DIFFERENTIAL AMPLIFIER AND CURRENT SOURCE

[75] Inventors: William D. Mack, Cupertino; Daniel J. Linebarger, San Jose, both of Calif.

[73] Assignee: North American Philips Corp., Signetics Division, Sunnyvale, Calif.

[21] Appl. No.: 610,639

[22] Filed: Nov. 8, 1990

[51] Int. Cl.⁵ .......................... H03F 3/14; H03F 3/45
[52] U.S. Cl. ..................................... 330/261; 330/260
[58] Field of Search ......................... 330/261, 258, 260

[56] References Cited

U.S. PATENT DOCUMENTS

| | | | |
|---|---|---|---|
| 4,287,477 | 9/1981 | Carlsen et al. | 330/260 |
| 4,442,408 | 4/1984 | Le | 330/261 |
| 4,539,491 | 9/1985 | Nishioka et al. | 330/260 |
| 4,560,921 | 12/1985 | Yamatake | 330/258 |
| 4,667,166 | 5/1987 | Itoh | 330/260 |
| 4,774,476 | 9/1988 | Ecklund et al. | 330/261 |

Primary Examiner—Eugene R. LaRoche
Assistant Examiner—Tan Dinh
Attorney, Agent, or Firm—R. Meetin; P. Verdonk; A. Tamoshunas

[57] ABSTRACT

The tail current of a differential transistor pair (12 and 14) is controlled by a feed-back means (40) that couples the pair's tail node (16) to the control input of each transistor for controlling a biasing current through each transistor. The control input of each transistor further receives an input signal in addition to an output signal of the feed-back means. As a result, the circuit has a stable and accurate tail current, and in addition is suitable for a low-voltage supply or for high-current operation.

13 Claims, 2 Drawing Sheets

MERGED DIFFERENTIAL AMPLIFIER AND CURRENT SOURCE

FIELD OF USE

The invention relates to an electronic circuit comprising first and second active devices having their respective main current paths coupled to a current source via a tail node.

BACKGROUND ART

Such electronic circuits as, for instance, emitter- and source-coupled transistor pairs are widely used, typically as differential amplifiers. The widespread use of these circuits arises, among other things, from the fact that differences between input signals can be amplified without their individual magnitudes being relevant. Further, the operation of the differential circuit strongly depends on the mutual matching of its components, specifically its transistors. The typical advantages of transistors fabricated in a monolithic technique render the differential pair particularly suitable for use in an integrated circuit. Another reason for the widespread use of such differential pairs is due to their ability of being cascaded directly without interstage coupling capacitances.

This kind of differential amplifier is biased by a current source at the tail node coupling the main current paths of the active devices, e.g. transistors. FIG. 1 shows an example of a differential amplifier in its simplest form. The amplifier comprises npn bipolar transistors 12 and 14, that have their emitters coupled to each other and to tail node 16, inputs 18 and 20, and outputs 22 and 24. The current source is constituted by a resistor 26 arranged between tail node 16 and a power supply node 28, the other supply node not being shown.

The compliance of such a circuit, i.e., the minimum power supply voltage to be applied to the circuit to make this particular circuit function correctly equals the sum of the voltage drop across the resistor 26 and the voltage drop across the main current path of one of the active devices, i.e. the collector - emitter path of transistor 12 or 14. This compliance value is generally the lowest that can be achieved for an amplifier/current source combination. The value of the bias current is determined by the value of this resistor 26 and by the value of the DC voltages at inputs 18 and 20. In this example the value of the bias current depends on the transistor-characteristics and therefore on temperature, supply voltage and the dc voltages at inputs 18 and 20. This causes the bias current to deviate from its nominal value. Since accurate setting of the bias current is required in many circuits, such deviation is undesirable.

FIG. 2 shows a known implementation of a current source that alleviates these problems. In FIG. 2 a main current path of a control transistor 30 is arranged between tail node 16 and resistor 26. Control transistor 30 receives a control voltage at its control input 32. This implementation uses the high output resistance of transistor 30 to minimize the variations in the bias current due to, for instance, changes in the power supply voltage. However, since the biasing current source now is formed by a series arrangement of control transistor 30 and resistor 26, the compliance of this implementation equals the sum of the voltage drops across one of transistors 12 and 14, the voltage drop across control transistor 30 and the voltage drop across resistor 26. The benefits of adding control transistor 30 are now offset by an increase in the power supply voltage that must be supplied to make the circuit function properly. Consequently, in low power supply electronic systems, such as portable battery-operated equipment, the control transistor architecture is undesirable. Also, in high-current applications, such as transmitters, the currents in differential transistor pair 12 and 14 generate such large voltage drops across the transistor pair's loads (not shown) that the voltages across transistors 12, 14 and 30 are reduced towards unacceptably low values, driving these transistors into their saturation range.

FIG. 3 shows a further known implementation of a biasing current source that uses an operational amplifier (op amp) 34 having an inverting input 36 coupled between control transistor 30 and resistor 26, a non-inverting input 38 for receiving a control voltage and an output coupled to the control transistor's control input 32. The op amp 34 impresses the control voltage across resistor 26, rendering the associated current independent of temperature, power supply voltage variations and transistor characteristics. However, the compliance of this circuit is the same as that of the circuit of FIG. 2.

OBJECT OF THE INVENTION

It is therefore an object of the invention to provide an electronic circuit of the above kind merging the benefits of a low voltage supply with the advantages of bias current independence of temperature, power supply voltage and characteristics of the active devices.

DISCLOSURE OF THE INVENTION

To this end an electronic circuit according to the invention, comprising first and second active devices having their respective main current paths coupled to a current source via a tail node, is provided with a feed-back means that couples the tail node to a device input of each device for controlling a current through each main current path under control of a control signal applied to the feed-back means. Each device input is further coupled to a signal input node for receiving an input signal different from the control signal.

The feed-back means sets up a feed-back loop that biases each active device at a bias current that only depends on the control signal. The compliance of the circuit now equals the minimum achievable compliance.

In a version of an electronic circuit according to the invention, the feed-back means includes a differential amplifier that has a first input for receiving the control signal, a second input coupled to the tail node, and an output coupled to the device inputs of the active devices. In order to maintain the voltage level at the tail node equal to the control signal's level the active devices are controlled by the differential amplifier in a feed-back loop.

Preferably, the differential amplifier in the feed-back means is coupled to the active devices' inputs via a resistive coupling. If the differential amplifier has a very low output resistance, the resistive coupling enables the input signals, that are to be fed to the devices' inputs, to generate voltages at the devices' inputs. If a signal source that supplies input signals to be processed by the active devices has an output resistance that is considerably lower than the resistance value of the resistive coupling, the signal source is preferably coupled to the inputs of the active devices via a further resistive coupling. This largely enables the output signal of the differential amplifier to produce a substantial voltage at the active devices' inputs.

At least one further active device may have its main current path coupled to the current source via the tail node, its device input being coupled to the output of the feed-back means. This architecture could be used, for instance, in a multiple-output electronic circuit.

Each active device may comprise a unipolar (field effect) transistor or a combination of unipolar transistors, a bipolar transistor or a combination of bipolar transistors, or any means wherein a current through a main current path is controllable via the means' input. The term "transistor" will be used herein for indicating any such active device.

BRIEF DESCRIPTION OF THE DRAWINGS

The invention will be explained hereinafter by way of example and with reference to the accompanying drawing in which.

For the sake of brevity, the same reference numerals are used throughout the figures for indicating elements or components performing similar or corresponding functions in the various circuits shown.

DESCRIPTION OF THE PREFERRED EMBODIMENTS

Figure 1:
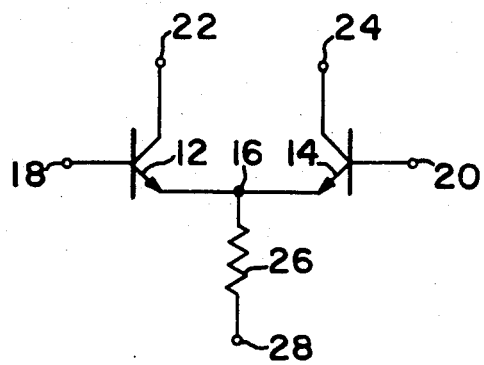
FIG. 1 shows a first type of a prior art circuit.
Figure 2:
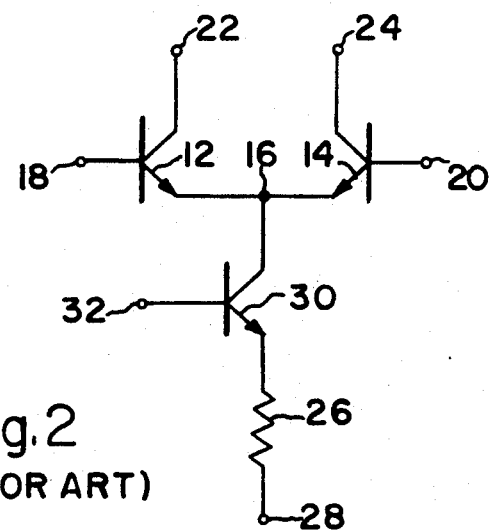
FIG. 2 shows a second type of a prior art circuit.
Figure 3:
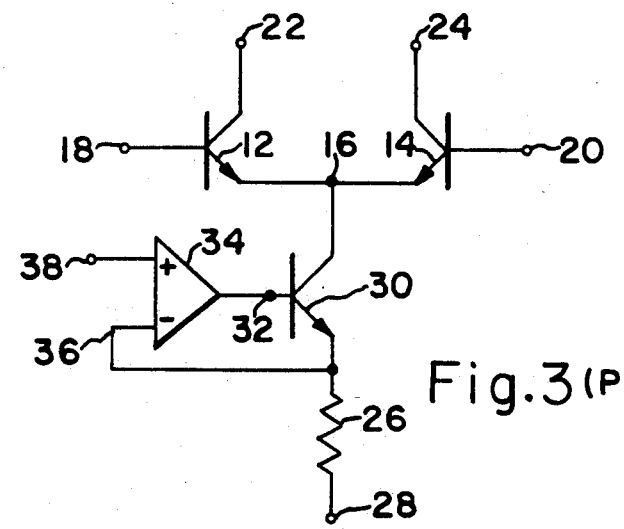
FIG. 3 shows a third type of a prior art circuit.
Figure 4:
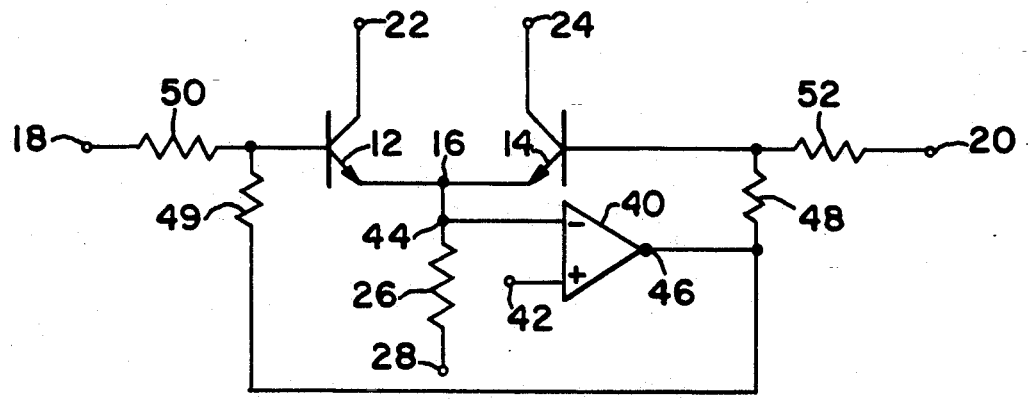
FIG. 4 shows a first example of a circuit according to the invention.

FIG. 4 shows a first example of a circuit according to the invention. The circuit comprises npn transistors 12 and 14 and resistor 26, all arranged as shown in FIG. 1. A feed-back network incorporates a differential amplifier 40 that receives at its non-inverting input 42 a control voltage and senses at its inverting input 44 a voltage caused by the tail current across resistor 26. Output 46 of amplifier 40 is coupled to the bases of transistors 12 and 14. Amplifier 40 has a sufficiently high gain to control transistors 12 and 14 in such a way that the voltage at input 44 is kept substantially equal to the control voltage applied to input 42. If the control signal at input 42 is a DC-signal a common mode feedback mechanism is established. If the control signal includes an AC-signal the feedback mechanism can be used to modulate the signals at outputs 24 and 22. The compliance of this circuit is the same as that for the circuit of FIG. 1 discussed herein above.

Preferably, resistors 48 and 49 are arranged between output 46 and transistors 12 and 14 if the output resistance of amplifier 40 is much lower than the input resistance of transistor 12 or 14. This provides a sufficient amplitude of a signal at the base of transistor 12 or 14. Likewise, if a signal source (not shown) having a low output resistance is coupled to inputs 18 and 20, resistors 50 and 52 are preferably inserted between these inputs and output 46.

Figure 5:
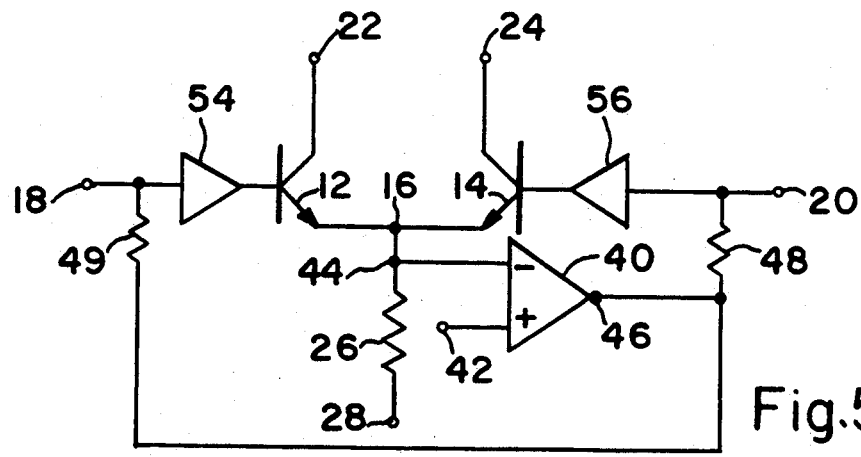
FIG. 5 shows a second example of a circuit according to the invention.

FIG. 5 shows a second example of a circuit according to the invention. Now, transistors 12 and 14 respond to the input signals applied to inputs 18 and 20 and the output signal of amplifier 40 through respective, largely identical pre-amplifiers 54 and 56 that amplify or attenuate these signals.

Figure 6:
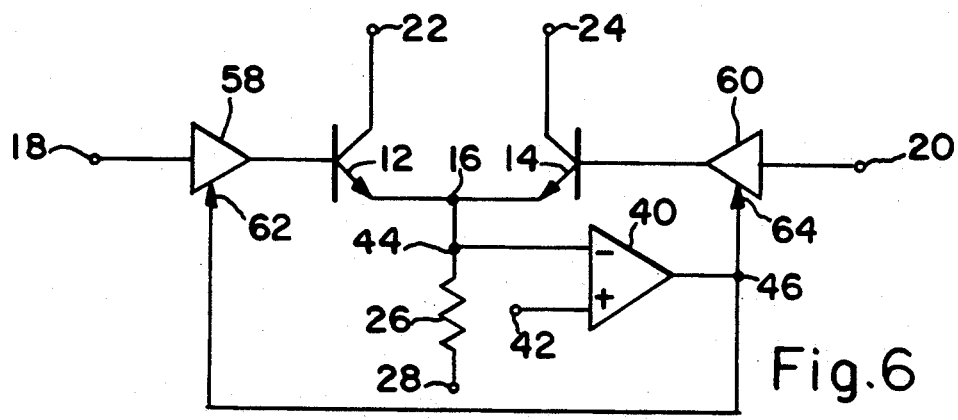
FIG. 6 shows a third example of a circuit according to the invention.

Alternatively, as shown in FIG. 6, pre-amplifiers 58 and 60 may be respectively arranged between inputs 18 and 20 on the one hand and the bases of transistors 12 and 14 on the other hand. Pre-amplifiers 58 and 60 have separate respective control inputs 62 and 64 coupled to output 46 for controlling the DC output level at the bases of transistors 12 and 14 in dependence on the control signal supplied by amplifier 40.

Figure 7:
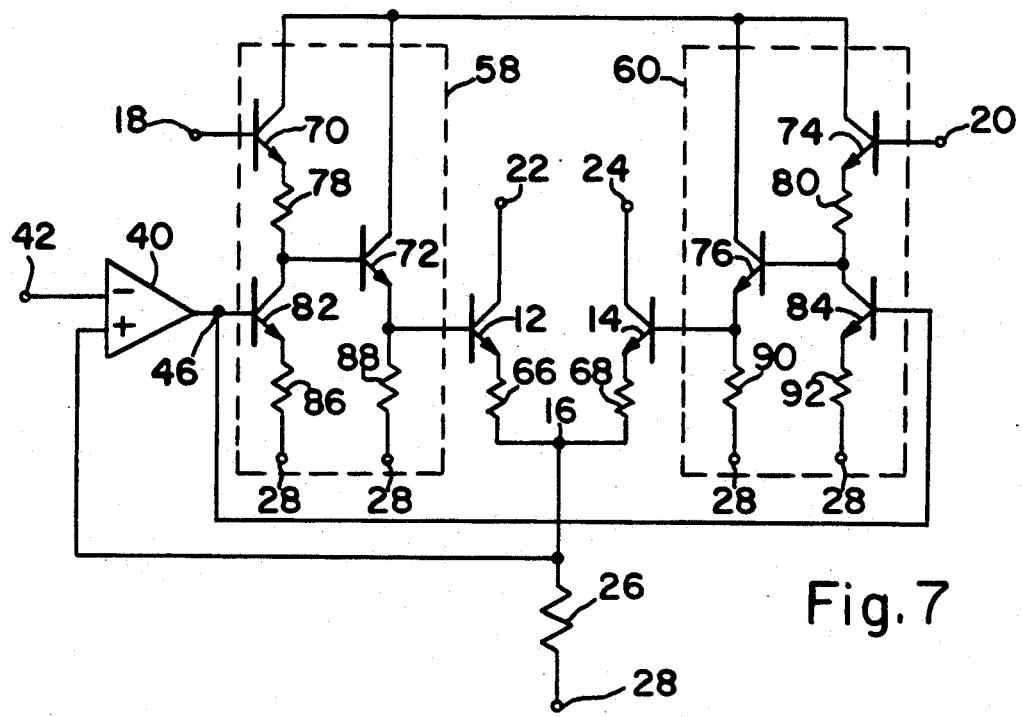
FIG. 7 shows a fourth example of a circuit according to the invention.

FIG. 7 shows a specific implementation of the circuit of FIG. 6. Degenerated transistors 12 and 14 have respective resistors 66 and 68 in their respective emitters. Resistors 66 and 68 function as damping devices for damping the ringing in the coupled transistor pair due to the transients caused by switch-overs. Typically resistors 66 and 68 each have a value of 2 ohms. Resistor 26 that couples tail node 16 to supply node 28 has a typical value of 5 ohms. Pre-amplifier 58 comprises a cascade of npn emitter followers 70 and 72, and pre-amplifier 60 comprises a cascade of npn emitter followers 74 and 76. Emitter followers 70 and 74 are respectively coupled to emitter followers 72 and 76 through resistors 78 and 80. Amplifier 40 controls the emitter followers 70 and 74 respectively through npn control transistors 82 and 84 that act as inverters. Therefore the signs of the inputs of amplifier 40 have been interchanged with respect to those in FIG. 6. Since the output resistance of each emitter follower 70 or 74 is low (typically 5 ohms) compared to the input resistance of emitter follower 72 or 76 (typically on the order of magnitude of 1 kiloohm), resistors 78 and 80 (typically 700 ohms) adequately increase the signals' amplitudes at the bases of transistors 72 and 76. Further resistors 86, 88, 90 and 92 function as current sources. Their resistance values are not critical with regard to the invention. The circuit of FIG. 7 is able to switch an output current of about 100 mA at outputs 22 and 24 in 1 nsec. The tail current through resistor 26 is adjustable within a typical range between 10 mA and 100 mA by varying the control voltage at control input 42.

What is claimed is:

1. An electronic circuit comprising:
   first and second signal input nodes for receiving first and second input signals;
   first and second active devices each having (i) a main current path and (ii) a device input coupled to a respective one of the signal input nodes for control of the main current path;
   a current source coupled to the main current paths via a tail node for biasing the active devices; and
   feed-back means that provides a common-mode coupling from the tail node to each device input for controlling a bias current through each main current path in response to a control signal, different from the first and second input signals, applied to the feed-back means, wherein the feed-back means includes:
   a differential amplifier with a first input for receiving the control signal, a second input coupled to the tail node, and an output, and
   a resistive coupling between the amplifier's output and each device input.

2. A circuit as in claim 1 wherein each signal input node is coupled to the device input of the respective active device via a resistor.

3. An electronic circuit comprising:

first and second signal input nodes for receiving first and second input signals;

first and second active devices each having (i) a main current path and (ii) a device input coupled to a respective one of the signal input nodes for control of the main current path;

a current source coupled to the main current paths via a tail node for biasing the active devices; and feed-back means that provides a common-mode coupling from the tail node to each device input for controlling a bias current through each main current path in response to a control signal, different from the first and second input signals, applied to the feed-back means, wherein the feed-back means includes:

a differential amplifier with a first input for receiving the control signal, a second input coupled to the tail node, and an output for providing an amplifier output signal, and first and second signal pre-amplifiers respectively responsive to the first and second input signals and responsive to amplifier output signal for controlling the first and second active devices.

4. A circuit as in claim 3 wherein each signal pre-amplifier has (i) a first input, coupled to the amplifier output for receiving the amplifier output signal and (ii) a further input coupled to a respective one of the first and second input nodes for receiving the associated input signal.

5. A circuit as in claim 4 wherein each pre-amplifier includes:

a third active device with a third device input coupled to the further input and with a third main current path, and a fourth active device with a fourth device input coupled to the output and with a fourth main current path connected to the third main current path via an intermediate node, wherein the intermediate node is coupled to the device input of a respective one of the first and second active devices.

6. A circuit as in claim 1 wherein the current source includes a resistor.

7. A circuit as in claim 3 wherein the current source includes a resistor.

8. A circuit as in claim 1 wherein at least one further active device has its main current path connected to the tail node and is controlled by the feed-back means.

9. A circuit as in claim 3 wherein at least one further active device has its main current path connected to the tail node and is controlled by the feed-back means.

10. A circuit as in claim 4 wherein:

each of the first and second active devices includes a bipolar transistor having an emitter coupled to the tail node via a respective resistor; and each signal pre-amplifier includes:

i) a third bipolar transistor with a base coupled to a respective one of the signal input nodes, ii) a further current source coupled to an emitter of the third bipolar transistor through a further resistor and having a control terminal coupled to the output of the differential amplifier, and iii) an emitter follower with a fourth bipolar transistor for coupling a further node between the further resistor and the further current source to the device input of a respective one of the first and second active devices.

11. A circuit as in claim 1 wherein each active device includes a transistor.

12. A circuit as in claim 3 wherein each active device includes a transistor.

13. A circuit as in claim 5 wherein each active device includes a transistor.

* * * * *